United States Patent [19]

Temes et al.

[11] Patent Number: 4,713,650
[45] Date of Patent: Dec. 15, 1987

[54] PIPELINED DIGITAL-TO-ANALOG CONVERTER

[75] Inventors: Gabor C. Temes; Fong J. Wang, both of Los Angeles, Calif.

[73] Assignee: Xerox Corporation, Stamford, Conn.

[21] Appl. No.: 922,658

[22] Filed: Oct. 24, 1986

[51] Int. Cl.⁴ .............................................. H03M 1/66
[52] U.S. Cl. .............................. 340/347 DA; 307/246
[58] Field of Search ................ 340/347 DA, 347 AD, 340/347 C; 307/246

[56] References Cited

U.S. PATENT DOCUMENTS 3,836,906  9/1974  Ando et al. ................. 340/347 DA
4,213,120  7/1980  Buchanan .................... 340/347 DA Primary Examiner—William M. Shoop, Jr.
Assistant Examiner—Richard K. Blum
Attorney, Agent, or Firm—Franklyn C. Weiss

[57] ABSTRACT

A pipelined digital to analog converter is disclosed which utilizes a series of three capacitor and switch sections to convert a three bit segment of a digital word into an analog voltage. For a ten bit digital word, three 3-capacitor sections would be required with an additional capacitor section. The voltage across the output, or last, capacitor is the analog voltage in direct relation to the input digital word. Each of the three capacitor sections works in relation to switched transistors to charge and discharge in a predetermined fashion said capacitors, in relation to the binary level of each of the three digits in the input digital word. The circuit operates from the least significant bit to the most significant bit, and converts the input digital word to an output analog voltage.

2 Claims, 2 Drawing Figures

PIPELINED DIGITAL-TO-ANALOG CONVERTER

This invention relates to a digital to analog converter wherein a series of three capacitor and transistor switch sections convert three bit segments of a digital word to an analog voltage which is pipelined to successive sections wherein the voltage across the last capacitor is, in fact, an analog representation of the applied digital signal.

BACKGROUND OF THE INVENTION

Most conventional techniques for digital to analog conversion require both high performance analog circuitry, such as operational amplifiers, and digital circuitry for counting, sequencing, and data storage. This has tended to result in hybrid circuits consisting of one or more bipolar analog integrated circuit chips and an MOS chip to perform the digital function. High performance and fairly complex signal processing has recently become possible on a single monolithic chip due to the fact that very accurate capacitor ratios could be obtained in MOS technology to replace cumbersome conventional techniques such as diffused resistors, complex thin film process, or ion implanted resistors. One problem with existing integratd circuits is that the area of silicon occupied by capacitors increases exponentially as a function of the number of input bits. Hence, in the prior art it has been difficult to get enough accuracy for ten bit resolution with reasonable silicon area. Also, for high speeds (say, $10^7$ conversions/second) the amplifiers may not be fast enough.

The present invention discloses a series of three capacitor and switch sections to convert a three bit segment of a digital word. For a ten bit digital word, for example, three 3-capacitor sections would be required with an additional capacitor section. The voltage across the output, or last, capacitor is the analog voltage in direct relation to the input digital word. Each of the three capacitor sections works in relation to switched transistors to charge and discharge, in a predetermined fashion, said capacitors, in relation to the binary level of each of the three digits in the input digital word. The circuit operates from the least significant bit to the most significant bit, and converts the input digital word to an output analog voltage.

DESCRIPTION OF THE DRAWINGS

For a more complete understanding of the invention, reference may be had to the following detailed description of the invention in conjunction with the drawings wherein.

DETAILED DESCRIPTION OF THE INVENTION

Figure 1:
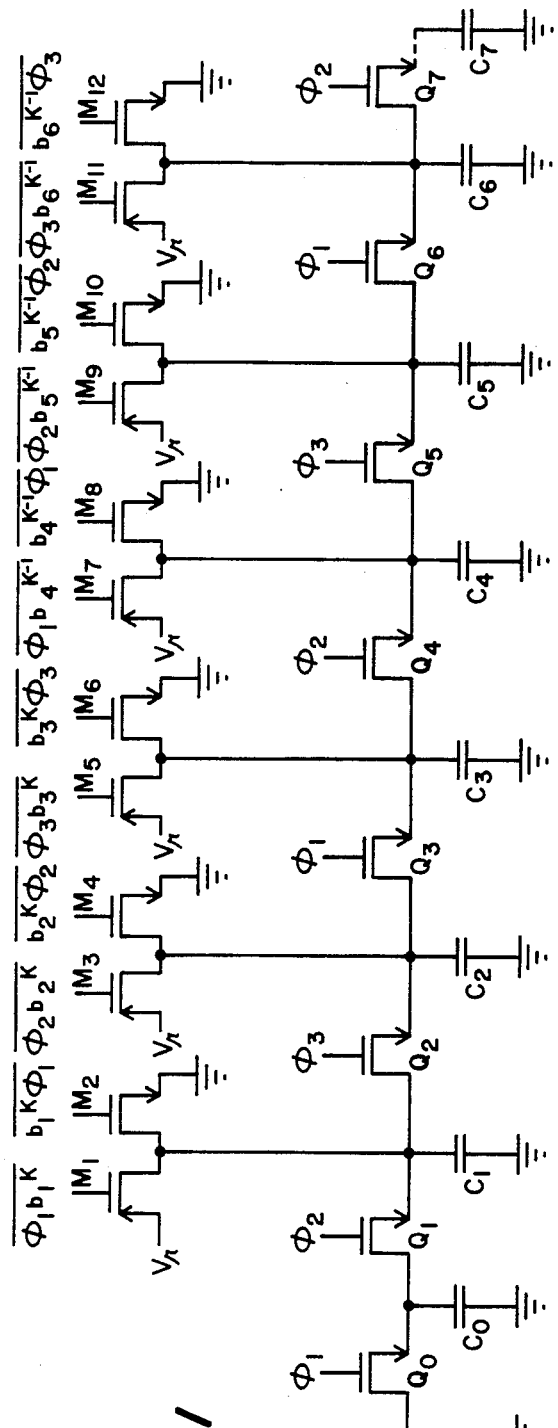
FIG. 1 is a schematic diagram of the digital to analog converter of the present invention showing two 3-capacitor sections.

FIG. 1 discloses a schematic diagram of a circuit which accomplishes the digital to analog conversion of the present invention, for 6-bit digital words. All capacitors are of equal size. Across the bottom of FIG. 1 can be seen capacitors $C_0$ through capacitor $C_7$. The next row up from the row of capacitors is a row of transistor switches $Q_0$ through $Q_7$. Each of these switch transistors is enabled by one of the timing signals $\Phi_1$, $\Phi_2$, or $\Phi_3$. A row of switching transistors $M_1$ through $M_{12}$ selectively couples the circuit to the input binary digits under analysis. The PMOS transistor $M_1$ would be responsive to the first binary digit $b_1^k$ if it was in the logic one state. The NMOS transistor $M_2$ would have the same first binary digit but be responsive to the logic zero state of this binary digit. The input to transistor $M_1$ is the voltage suply $V_R$ which, as an example, may be 5 volts. The input to transistor $M_2$ is connected to ground potential. Thus, the source electrode of transistor $M_1$ is coupled to voltage $V_r$, the gate electrode when $\Phi_1$ is high is coupled to the input binary digit, while the drain electrode is coupled to the drain electrode of transistor $M_2$ and to the capacitor network as shown in FIG. 1. When $\Phi_1$ is high, transistor $M_2$'s gate electrode is coupled to the complement of the input binary digit, while the source electrode of transistor $M_2$ is connected to ground. The subsequent capacitor combinations are similar and will be described hereinafter.

When phase signal $\Phi_1$ is applied to the circuit, none of the other two phase signals $\Phi_2$ or $\Phi_3$ are applied; thus they are non-overlapping timing signals. When timing signal $\Phi_1$ is applied, transistor $M_1$ or $M_2$ would be enabled depending upon whether or not the input binary digit is a logic one or a logic zero. Also, upon the application of timing signal $\Phi_1$, transistor switch $Q_0$ is closed and capacitor $C_0$ is coupled directly to ground through transistor $Q_0$, thus discharging it completely. Transistor switch $Q_1$ is open because timing signal $\Phi_2$ has not yet been applied to transistor $Q_1$. Thus, at $\Phi_1 = 1$, if the binary digit applied is a logic one, then transistor switch $M_1$ is closed, $M_2$ remains open, and the supply voltage $V_R$ is applied directly to and charges capacitor $C_1$. As stated above, transistor $Q_1$ is open because $\Phi_2$ has not been applied; as is transistor $Q_2$ open because timing signal $\Phi_3$ has not been applied. Thus, at this particular moment T, with a binary digit $b_1$ being in the logic one state, transistor $M_1$ is on, with $V_R$ charging capacitor $C_1$ to $V_R$, which in this instance may be 5 volts. The resulting charge in $C_1$ is $q = C_1 V_R$.

While the rest of the description will be analyzed with all binary one digits applied, it can be seen, however, that if binary digit $b_1$ is a logic zero, transistor $Q_0$ would still be closed, capacitor $C_0$ would still be discharged to ground, transistors $Q_1$ and $Q_2$ would still be open because of the absence of timing signals $\Phi_2$ and $\Phi_3$, but now transistor $M_2$ would be directly coupled to ground thereby discharging capacitor $C_1$ to ground potential.

Figure 2:
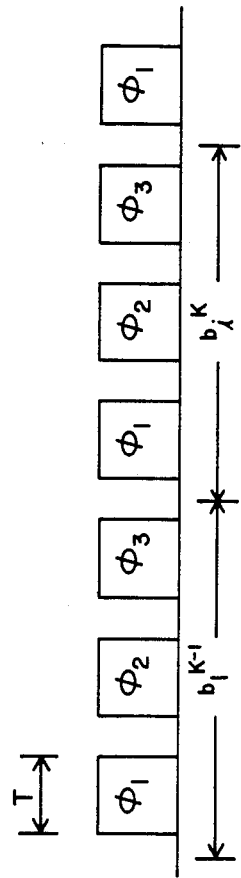
FIG. 2 is a schematic diagram of the sequence of timing signals applied to and utilized in the present invention.

When timing signal $\Phi_1$ turns off and a finite time elapses, timing signal $\Phi_2$ is now applied, see FIG. 2. Transistor $Q_0$ opens, transistor $Q_1$ closes, transistor $Q_3$ remains open, capacitors $C_0$ and $C_1$ are now connected through transistor $Q_1$ in parallel and share their capacitive charge with each other. However, since $C_0$ had no charge while $C_1$ was charged to 5 volts, the charge on both $C_0$ and $C_1$ is now $q/2$. At this moment, assuming that bit $b_2$ is also a logic one, capacitor $C_2$ is charging to the supply voltage $V_R$. Since at this moment timing signal $\Phi_3$ is off, transistor $Q_2$ is open. Thus, at this particular time, the charge on capacitor $C_0$ is $q/2$, the charge on capacitor $C_1$ is $q/2$, while the charge on capacitor $C_2$ is equal to q.

Thus, the charge in the combined parallel capacitor combination of $C_0$ and $C_1$ is now q while the voltage is $V_R/2 = 2.5$ volts. The voltage on capacitor $C_2$ is equal to 5 volts at this moment. However, when timing signal $\Phi_2$ turns off, capacitor $C_1$ is alone again with a voltage of 2.5 volts and a charge of $q/2$. Capacitor $C_2$ is also alone at this moment with a voltage of 5 volts and a charge of $q$.

When the next timing signal $\Phi_3$ goes high, capacitors $C_1$ and $C_2$ are now connected in parallel for the first time. Thus, these capacitors, $C_1$ and $C_2$, share their charges as other capacitors share their charges above; so at this particular moment, the total charge of capacitors $C_1$ and $C_2$ is $3q/2$, because the charge on capacitor $C_1$ is $q/2$ while the charge on capacitor $C_2$ is $q$, the total charge being $3q/2$. Since each value of capacitance for capacitors $C_0$ through $C_6$ is the same, the voltage on each of the capacitors $C_1$ and $C_2$ is now the average of the 2.5 volts and the 5 volts, or combined voltage of 3.75 volts. Next, phase signal $\Phi_3$ would go low leaving the 3.75 volt signal level on capacitor $C_2$. Now, when timing signal $\Phi_1$ goes high again, the charge on capacitor $C_2$, that is $3q/4$, is shared with capacitor $C_3$ which is now charged to the charge $q$ if the signal of bit 3 in the digital word is a logic 1. As above, the voltage on capacitor $C_3$ is 5 volts but when it shares its voltage with capacitor $C_2$, which above was seen to be 3.75 volts, the resultant voltage on capacitor $C_3$ when timing signal $\Phi_1$ goes low and $C_3$ is isolated will be reduced. The voltage at this point on capacitor $C_3$ would be the average of the 3.75 volts with the 5 volt signal or 4.375 volts at this particular moment. The charge is thus propagated along but is divided by two every time. Thus is introduced the weighting of the voltage by powers of 2. The formula for output voltage, for the case when all digits of the digital word equal 1, is therefore $$V_0 = V_R(1 - 2^{-N})$$

where $N$ is the number of bits $b_i$. Thus, for a 4 bit word the resultant output analog voltage for a 4 bit word of all logic 1's would be 4.6875 volts; while for an 8 bit word the output analog voltage for all 1's in the 8 bit word would be approximately 4.98 volts. The voltage would decrease down to zero linearly for a combination of input binary digits of all logic zeroes. In the general case, the formula giving the output voltage is $$V_0 = (V_R/2)(b_N + 2^{-1}b_{N-1} + \ldots + 2^{-N+1}b_1).$$

Each of the three capacitor sections could have the input bits applied simultaneously and stored at the inputs to transistors $M_1$, $M_2$, $M_3$, $M_4$, $M_5$, or $M_6$, because the phase pulses $\Phi_1$, $\Phi_2$, and $\Phi_3$ are sequential and non-overlapping. For a 10 bit converter, the circuit would comprise three 3-capacitor sections with an additional capacitor stage to equal 10 stages. It is the right most capacitor that has the output analog voltage on it. The last capacitor in FIG. 1 is designated $C_6$, but in general can be $C_N$ for any number $N$ of binary digits. If, however, the input digits were exactly six as shown in FIG. 1, capacitor $C_6$ would be the output capacitor.

The main advantage to the above circuit is that no amplifiers are needed which would slow down the operation. The circuit only uses the capacitors and the switching transistors as set forth in the Figure.

Since the circuit shown updates the output voltage across $C_N$ only once in each 3 block cycles, 3 switched capacitor arrays, similar to that shown in FIG. 1 but operated by clock signals which are shifted by one clock interval from array to array, may be combined to realize a system which generates a new analog output signal in each clock interval.

It can be shown that clock feedthrough effects affect only the gain and the offset voltage, but not the linearity of the converter. This is acceptable in many applications.

While the invention has been described with reference to a specific embodiment, it will be understood by those skilled in the art that various changes may be made and equivalents may be substituted for elements thereof without departing from the true spirit and scope of the invention. In addition, many modifications may be made without departing from the essential teachings of the invention. For instance, two reference voltages $V_{R1}$ and $V_{R2}$ may be used in FIG. 1 at the sources of $M_1$-$M_2$, $M_3$-$M_4$, etc., rather than $V_R$ and ground.

What is claimed is:

1. A digital to analog converter comprising:
a plurality of capacitor and transistor switch sections, each of said sections for converting three digits of a binary digital signal to an output analog voltage, each of said sections comprising:
first, second, and third pairs of input switching transistors, wherein the first transistor in each said pair is enabled and transfers a predetermined reference voltage only in response to a logic one in the input binary digit, while the second transistor in each said pair is enabled and thus transfers a ground voltage only in response to a logic zero in the same input binary digit,
first, second, and third output switching transistors coupled to said first, second, and third pairs of input switching transistors and responsive to first, second, and third independent and non-overlapping enabling signals, and
first, second, and third equal size capacitors coupled to said first, second, and third output switching transistors and to ground potential, wherein said first, second, and third capacitors are selectively connected to said ground potential or said reference or ground voltage from said input pairs of switching transistors in response to said applied binary digits, said enabling signals being sequentially applied to said first, second, and third output switching means to discharge said capacitors and combine stored charges thereon, such that an analog voltage representative of said applied digital signal is produced and selectively moved from said capacitor to capacitor from the least significant bits to the most significant bits in said applied digital signal.

2. The digital to analog converter as set forth in claim 1 wherein the output analog voltage is $$V_0 = (V_R/2)(b_N + 2^{-1}b_{N-1} + \ldots + 2^{-N+1}b_1)$$

where $V_0$ is the output voltage, $V_R$ is the reference voltage, and $N$ is the number of input binary digits.

* * * * *